United States Patent
Porwol et al.

(10) Patent No.: US 9,953,846 B2
(45) Date of Patent: Apr. 24, 2018

(54) METHOD FOR FABRICATING A SEMICONDUCTOR CHIP PANEL

(71) Applicant: Infineon Technologies AG, Neubiberg (DE)

(72) Inventors: Daniel Porwol, Straubing (DE); Edward Fuergut, Dasing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/261,354

(22) Filed: Sep. 9, 2016

(65) Prior Publication Data

US 2016/0379847 A1    Dec. 29, 2016

Related U.S. Application Data

(62) Division of application No. 13/741,113, filed on Jan. 14, 2013, now Pat. No. 9,455,160.

(51) Int. Cl.
| | |
|---|---|
| *H01L 21/00* | (2006.01) |
| *H01L 21/56* | (2006.01) |
| *H01L 23/28* | (2006.01) |
| *H01L 23/00* | (2006.01) |
| *H01L 23/31* | (2006.01) |

(52) U.S. Cl.
CPC ............ *H01L 21/566* (2013.01); *H01L 21/56* (2013.01); *H01L 21/561* (2013.01); *H01L 21/568* (2013.01); *H01L 23/28* (2013.01); *H01L 24/96* (2013.01); *H01L 23/3107* (2013.01); *H01L 23/3121* (2013.01); *H01L 2924/12041* (2013.01); *H01L 2924/12042* (2013.01); *H01L 2924/1305* (2013.01); *H01L 2924/13055* (2013.01); *H01L 2924/13091* (2013.01); *H01L 2924/1461* (2013.01); *H01L 2924/181* (2013.01)

(58) Field of Classification Search
CPC .......... H01L 2924/181; H01L 25/0655; H01L 21/56; H01L 2224/97; H01L 2224/96
USPC ................ 438/108, 113, 125, 126, 127, 107
See application file for complete search history.

(56) References Cited

U.S. PATENT DOCUMENTS

| | | | |
|---|---|---|---|
| 6,734,534 B1 | 5/2004 | Vu et al. | |
| 6,897,096 B2 * | 5/2005 | Cobbley | ................. H01L 21/56 257/E21.502 |
| 7,759,163 B2 * | 7/2010 | Kroeninger | ........... H01L 21/568 257/690 |
| 7,956,459 B2 * | 6/2011 | Lim | ..................... H01L 21/561 257/724 |
| 7,969,026 B2 | 6/2011 | Lytle et al. | |

(Continued)

FOREIGN PATENT DOCUMENTS

| | | |
|---|---|---|
| CN | 101409241 A | 4/2009 |
| CN | 102468189 A | 5/2012 |
| EP | 1612021 A1 | 1/2006 |

*Primary Examiner* — S. V. Clark

(74) *Attorney, Agent, or Firm* — Slater Matsil, LLP

(57) ABSTRACT

A method for fabricating a semiconductor chip is disclosed. In an embodiment, the method includes providing a carrier, providing a plurality of semiconductor chips, the semiconductor chips each including a first main face and a second main face opposite to the first main face and side faces connecting the first and second main faces, placing the semiconductor chips on the carrier with the second main faces facing the carrier, and applying an encapsulation material to the side faces of the semiconductor chips.

11 Claims, 6 Drawing Sheets

(56) References Cited

U.S. PATENT DOCUMENTS

| | | |
|---|---|---|
| 8,035,213 B2 | 10/2011 | Lee et al. |
| 8,217,504 B2 | 7/2012 | Meyer et al. |
| 2006/0014328 A1 | 1/2006 | Shimonaka et al. |
| 2007/0059866 A1 | 3/2007 | Yang et al. |
| 2007/0296065 A1 | 12/2007 | Yew et al. |
| 2008/0085572 A1 | 4/2008 | Yang et al. |
| 2008/0224296 A1 | 9/2008 | Meyer et al. |
| 2009/0091022 A1 | 4/2009 | Meyer et al. |
| 2009/0236749 A1* | 9/2009 | Otremba ............ H01L 23/36 257/774 |
| 2009/0261468 A1 | 10/2009 | Kroeninger et al. |
| 2010/0019370 A1 | 1/2010 | Pressel et al. |
| 2010/0072618 A1 | 3/2010 | Camacho et al. |
| 2012/0119378 A1 | 5/2012 | Ng et al. |
| 2013/0256923 A1 | 10/2013 | Phua et al. |
| 2015/0262844 A1* | 9/2015 | Meyer ............ H01L 23/3107 257/737 |
| 2015/0318262 A1* | 11/2015 | Gu ............ H01L 21/568 257/738 |
| 2016/0276279 A1* | 9/2016 | Meyer ............ H01L 21/568 |

\* cited by examiner

METHOD FOR FABRICATING A SEMICONDUCTOR CHIP PANEL

CROSS-REFERENCE TO RELATED APPLICATIONS

This application is a divisional of U.S. patent application Ser. No. 13/741,113, filed on Jan. 14, 2013, and entitled "Method for Fabricating a Semiconductor Chip Panel," which application is hereby incorporated herein by reference.

TECHNICAL FIELD

The present invention relates to a method for fabricating a semiconductor chip panel and to a semiconductor chip package.

BACKGROUND

In power electronics very often semiconductor chips with vertical transistors like, for example, IGBT (Insulated Gate Bipolar Transistors) are used or, in general, transistors in which at least one electrical contact pad is arranged on a first main face of the semiconductor chip and at least one other electrical contact pad is arranged on a second main face opposite to the first main face. Several ones of these semiconductor chips can be connected to form power modules or power systems. One example of such power modules are the so-called intelligent power modules (IPMs).

In a fabrication process of a semiconductor chip package either an individual semiconductor chip or a semiconductor chip module comprising several semiconductor chips may be embedded in a mold compound which may comprise any sort of encapsulation material. The fabrication process can be performed on a wafer level basis. During the fabrication process it might be necessary to fabricate electrical interconnections between different semiconductor chips within one semiconductor chip module. As in many cases semiconductor power chips comprise contact elements on both main surfaces thereof, it might be advantageous if semiconductor chips could be easily accessed from both sides to fabricate the electrical interconnections. One further aspect is the emergence and development of new semiconductor materials for power semiconductor chips like, for example, SiC or GaN, which require conditions different from that in silicon power chips like, for example, higher temperatures for efficient and fast switching.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1:
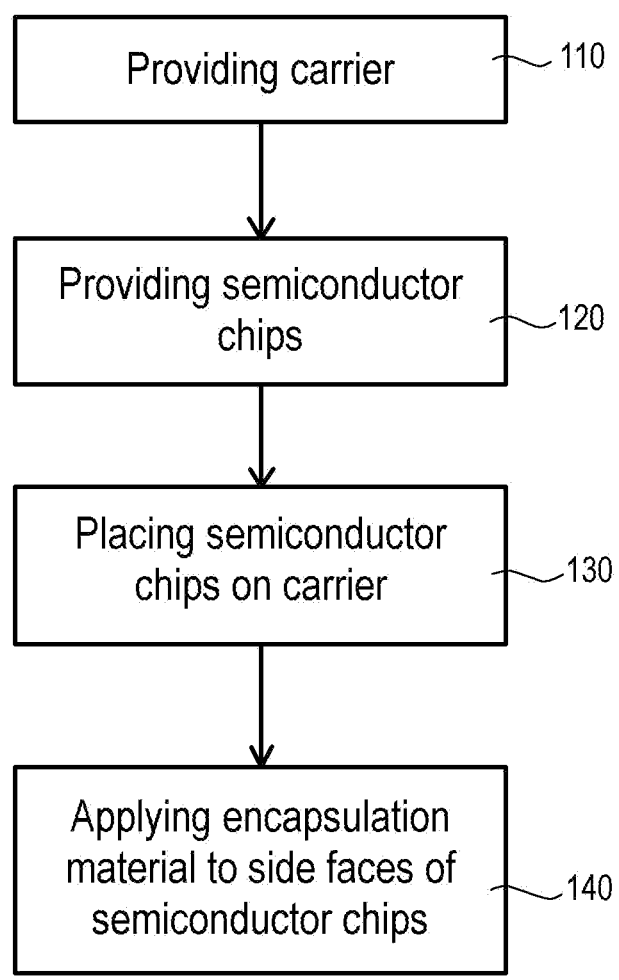
FIG. 1 shows a flow diagram for illustrating a method for fabricating a semiconductor chip panel according to an embodiment.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a method for fabricating a semiconductor chip panel and of a semiconductor chip package may use various types of semiconductor chips or semiconductor chip modules or circuits incorporated in the semiconductor chips, among them logic integrated circuits, analogue integrated circuits, mixed signal integrated circuits, sensor circuits, MEMS (Micro-Electro-Mechanical-Systems), power integrated circuits, chips with integrated passives, diodes like flyback diodes, etc. The embodiments may also use semiconductor chips comprising MOS transistor structures or vertical transistor structures like, for example, IGBT (Insulated Gate Bipolar Transistor) structures or, in general, transistors or other structures or devices in which at least one electrical contact pad is arranged on a first main face of the semiconductor chip and at least one other electrical contact pad is arranged on a second main face of the semiconductor chip opposite to the first main face of the semiconductor chip. The semiconductor chips may also comprise optical devices like, for example, light emitting diodes, laser diodes, or optical receiver diodes.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor chip. The contact elements or contact pads may be made from any electrically conducting material, e.g., from a metal as aluminum, gold, or copper, for example, or a metal alloy, or an electrically conducting organic material, or an electrically conducting semiconductor material. The contact elements may also be formed as layer stacks of one or more of the above-mentioned materials.

A semiconductor chip panel may comprise an encapsulant or encapsulating material having the semiconductor chips or semiconductor chip modules embedded therein. The encapsulating material can be any electrically insulating material like, for example, any kind of molding material, any kind of resin material, or any kind of epoxy material. The encapsulating material can also be a polymer material, a polyimide material, a thermoplast material, a silicone material, a ceramic material, and a glass material. The encapsulating material may also comprise any of the above-mentioned materials and further include filler materials embedded therein like, for example, thermally conductive increments. These filler increments can be made of AlO or $Al_2O_3$, AlN, BN, or SiN, for example. The semiconductor chip panel can have the form of a wafer, i.e., a circular form, but is not limited to the form and shape of a wafer but can have any size and shape and any suitable arrangement of semiconductor chips or semiconductor chip modules embedded therein.

In the claims and in the following description different embodiments of a method for fabricating a semiconductor chip panel are described as a particular sequence of processes or measures, in particular in the flow diagram. It is to be noted that the embodiments should not be limited to the particular sequence described. Particular ones or all of different processes or measures can also be conducted simultaneously or in any other useful and appropriate sequence.

The semiconductor chip panel may include one or more of individual semiconductor chips or semiconductor chip modules. The semiconductor chip modules may include two or more semiconductor chips, in particular power transistor chips, and they may include at least one further semiconductor chip which may include one or more of a logic circuit or a driver circuit. In particular, the semiconductor chip modules may comprise the so-called intelligent power modules (IPMs). The semiconductor chip panel may also comprise any other kind of semiconductor chips as were mentioned above.

FIG. 1 shows a flow diagram for illustrating a method for fabricating a semiconductor chip panel according to an embodiment. The method 100 of FIG. 1 comprises providing a carrier (110), which may comprise any sort of solid material like, for example, metal, glass, ceramic, semiconductor (Si), etc. The carrier may be prepared at an upper main face thereof in a way so that a temporary bonding of semiconductor chips is possible. The carrier may, for example, comprise an adhesive layer or foil applied to a main face of the carrier. The method further comprises providing a plurality of semiconductor chips (120), wherein the semiconductor chips may each comprise a first main face and a second main face opposite to the first main face and side faces connecting the first and second main faces. The method further comprises placing the semiconductor chips on the carrier with the second main faces facing the carrier (130), wherein the semiconductor chips may be attached with their second main faces to the adhesive layer or foil situated on the carrier. The method further comprises applying an encapsulation material to the side faces of the semiconductor chips (140), wherein the encapsulation material may be applied in such a way that only the side faces of the semiconductor chips are covered with the encapsulation material and appropriate measures provisions are taken so that the encapsulation material will not be applied to the first main faces of the semiconductor chips.

According to an embodiment of the method 100 of FIG. 1, the first main faces of the semiconductor chips are covered by a so-called release film which serves the purpose to prevent the encapsulation material to be applied to the first main faces. The release film may comprise a thermoplastic foil, a polymer film or a polymer foil, in particular comprising teflon, PTFE, ETFE or PET. The release film can also be formed in such a way that it allows the formation of a support structure at the edge of the semiconductor chip panel which may be of advantage in particular in the case of the formation of a very thin semiconductor chip panel resulting from very thin semiconductor chips. An embodiment thereof will be shown later in some more details.

According to an embodiment of the method 100 of FIG. 1, applying the encapsulation material comprises molding, in particular transfer molding. The encapsulation material may comprise one or more of an insulating material, a mold material, a polymer material, a polyimide material, a resin material, an epoxy resin material, a silicone material, a ceramic material, and a glass material. According to an embodiment of the method 100 of FIG. 1, the semiconductor chip panel to be fabricated comprises a plurality of semiconductor chips or semiconductor chip modules. The semiconductor chips may comprise a first main face and a second main face opposite to the first main face, wherein the first main face comprises a first contact element and the second main face comprises a second contact element. At least part of the semiconductor chips may comprise one or more of a transistor, a power transistor, a vertical transistor, an MOS transistor, an insulated gate bipolar transistor, a logic circuit, a sensor, and a passive component. The semiconductor chip panel may include one or more of individual semiconductor chips or semiconductor chip modules. The semiconductor chip modules may include two or more semiconductor chips, in particular power semiconductor chips, and they may include at least one further semiconductor chip which may include one or more of a logic circuit or a driver circuit.

In particular, the semiconductor chip modules may comprise the so-called intelligent power modules (IPMs).

According to an embodiment of the method 100 of FIG. 1, the thickness of the semiconductor chips may cover a wide range from 5 μm to 800 μm or even 1 mm in the case of an ungrinded semiconductor wafer. At least part of the semiconductor chips may comprise a thickness in a range from 5 μm-100 μm, in particular from 30 μm-80 μm.

According to an embodiment of the method 100 of FIG. 1, the semiconductor chip panel to be fabricated comprises a plurality of similar or identical semiconductor chips. The semiconductor chips can be placed on the carrier having one and the same spatial orientation which means, for example, that the semiconductor chips are placed in such a way that an active surface comprising electrical contact elements are situated either remote from the carrier or facing the carrier. It is also possible to place the semiconductor chips on the carrier with different spatial orientation wherein, for example, a first group of semiconductor chips have their active surface situated facing the carrier and a second group of semiconductor chips have their active surface situated remote from the carrier wherein in particular the semiconductor chips can be placed in an alternate manner along a row of semiconductor chips.

According to an embodiment of the method 100 of FIG. 1, at least part of the semiconductor chips can at first be placed on one or more interposers as, for example, leadframes and thereafter the interposers are mounted on the carrier.

According to an embodiment of the method 100 of FIG. 1, via holes can be formed into the encapsulation material, in particular for the purpose of forming electrical through-connections for electrically connecting different semiconductor chips with each other in order to build up semiconductor chip modules.

FIGS. 2A-2D show schematic cross-sectional side view representations for illustrating an example of a method for fabricating a semiconductor chip panel. According to FIG. 2A, a carrier 200 is provided which may have the shape of a wafer, i.e., a circular shape, and which may be comprised of any solid material like, for example, of metal, ceramic, glass, or silicone. On an upper main face of the carrier 200 an adhesive layer 210 like, for example, a double-sided adhesive foil or tape can be attached which can be selected such that it can be easily peeled off the carrier 200 and the fabricated semiconductor chip panel at the end of the molding process. On the adhesive layer 210 a plurality of semiconductor chips 220 can be attached, for example, by means of a pick-and-place process. The semiconductor chips 220 can be placed in a matrix arrangement. The semiconductor chips 220 may have been fabricated in a previous fabrication process on a semiconductor wafer and then diced out of the semiconductor wafer to form a plurality of individually manageable chips which can then be placed on the adhesive layer 210 in a predetermined spatial distance from each other. The semiconductor chips 220 can be comprised of, for example, semiconductor power chips, in particular those having a vertical structure. The semiconductor chips 220 can also comprise any other electrical or mechanical-electrical devices as outlined above. The semiconductor chips 220 comprise first upper main faces situated remote from the carrier 200 and second lower main faces opposite to the first main faces and situated facing the carrier 200. The semiconductor chips 220 can have a usual rectangular form so that they comprise four side faces connecting the first and second main faces.

Figure 2A:
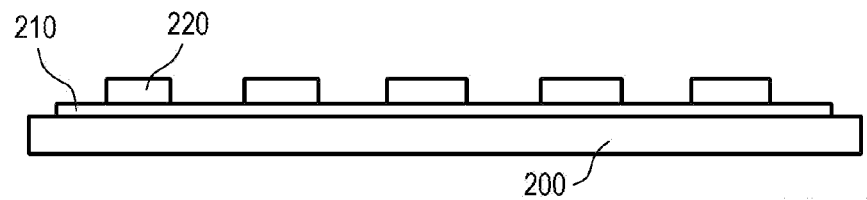
FIGS. 2A-2D show schematic cross-sectional side view representations for illustrating a method for fabricating a semiconductor chip panel according to an embodiment.
Figure 2B:
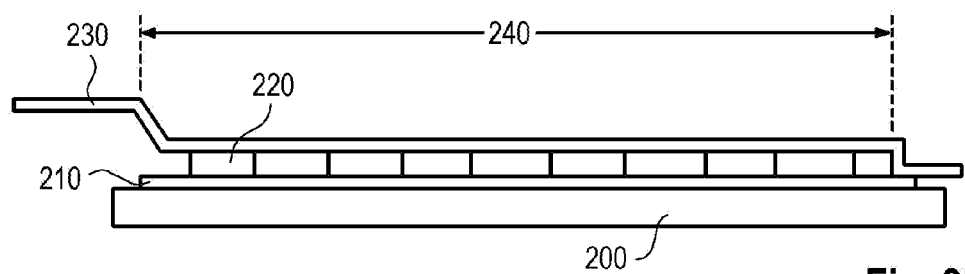

FIG. 2B shows a situation in which the assembly comprising the carrier 200 and the applied semiconductor chips 220 may be placed within a molding apparatus, in particular in a transfer molding apparatus, the technical details of which are not shown here for reasons of simplicity. Inside the molding apparatus a release film 230 may be provided which covers the upper, first main faces of the semiconductor chips 220. The release film 230 is employed in order to prevent that encapsulation material is applied to the upper first surfaces of the semiconductor chips 220. To this end, a stamp 240 can be employed to press the release film 230 down onto the upper surfaces of the semiconductor chips 220.

Figure 2C:
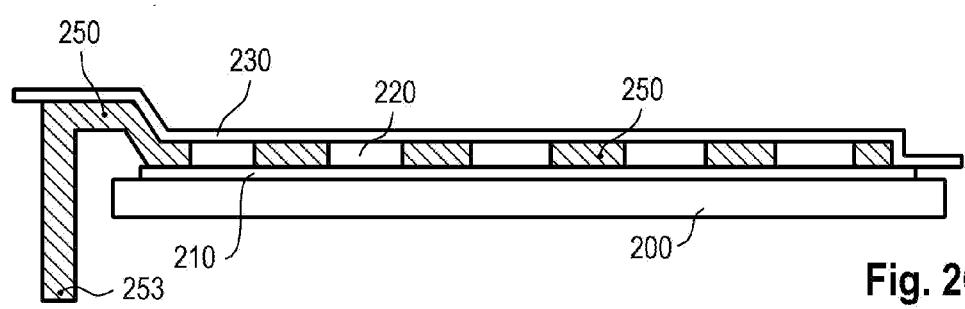

As shown in FIG. 2C, this can be followed by a usual transfer molding process wherein the encapsulation or molding material is first liquefied by heat and pressure, and then forced into the closed and evacuated mold cavity of the molding apparatus and held there under additional heat and pressure until all encapsulation material 250 is solidified, i.e., cured. The solidified encapsulation material 250 is indicated by the hatched areas. In the molding process the encapsulation material 250 flows only into the intermediate spaces between the semiconductor chips 220, but not on the first upper surfaces of the semiconductor chips 220 due to the presence of the release film 230. Also shown in FIG. 2C is the plunger 251 which results from the transfer molding process.

Figure 2D:
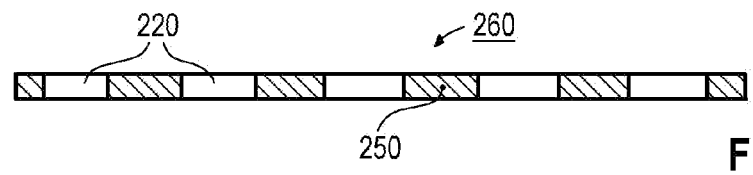

As shown in FIG. 2D, after opening the molding apparatus, the encapsulated semiconductor chips 220 are unloaded in the form of a semiconductor chip panel 260. In the semiconductor chip panel 260 all semiconductor chips 220 are encapsulated by the encapsulation material 250 only at their four side faces but not at their first and second main faces. The fabrication method therefore produces a semiconductor chip panel 260 comprising double-exposed semiconductor chips 220 encapsulated only at the side faces by the encapsulation material 250.

At next the release film 230, which can be supplied at one end of the mold form from a film roll and rolled up at the opposite end of the mold form, can be transported across one length of the mold form and a new cycle can start by again placing a carrier 200 with semiconductor chips 220 inside the molding cavity of the molding apparatus.

Figure 3A:
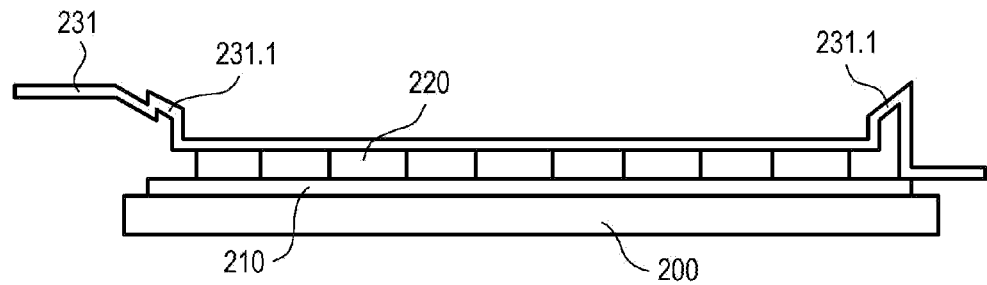
FIGS. 3A-3C show schematic cross-sectional side view representations for illustrating a method for fabricating a semiconductor chip panel comprising an edge supporting structure.
Figure 3B:
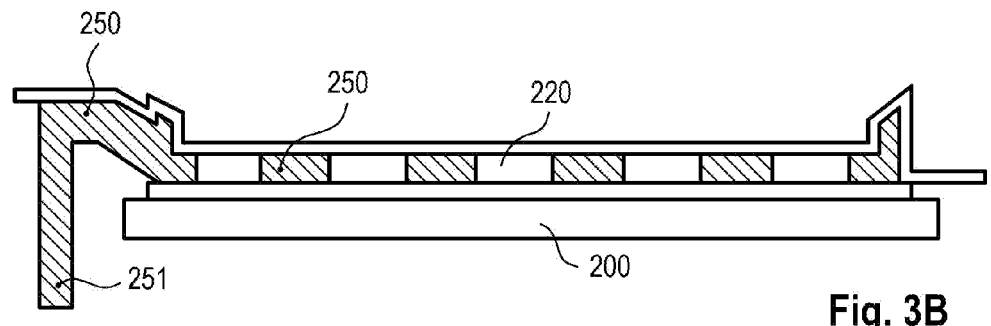
Figure 3C:
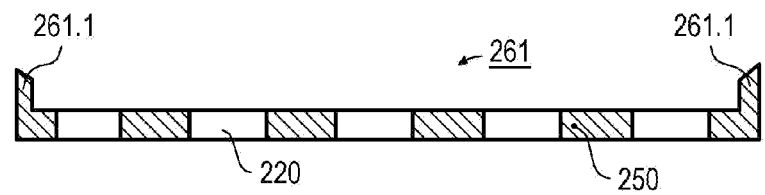

FIGS. 3A-3C illustrate a further example of a fabrication process in which very thin semiconductor chips are to be encapsulated which necessarily leads to a semiconductor chip panel of a thickness corresponding to the thickness of the semiconductor chips. This semiconductor chip panel will therefore need a stabilizing structure in order to allow or facilitate the further processing after the molding process.

As shown in FIG. 3A, the stabilizing or supporting structure can be produced by a release film 231 which comprises a ring-like protrusion 231.1. Again as in the embodiment of FIG. 2A-2D, the form of the release film 231 can be determined by a stamp (not shown here) pressing from above onto the release film 231 down to the upper surfaces of the semiconductor chips 220. Then the transfer molding process is performed according to FIG. 3B. The protrusion 231.1 allows the formation of a stabilization ring 261.1 of the fabricated semiconductor chip panel 261, as shown in FIG. 3C.

FIGS. 4A-4E show schematic cross-sectional side view representations of several examples of semiconductor chip panels which might be fabricated by the above-described fabrication process. The semiconductor chips may have an active surface which may be defined as the surface on which electrical contact elements. In this sense the semiconductor chips may also have two active surfaces as in case of vertical transistor device chips.

Figure 4A:
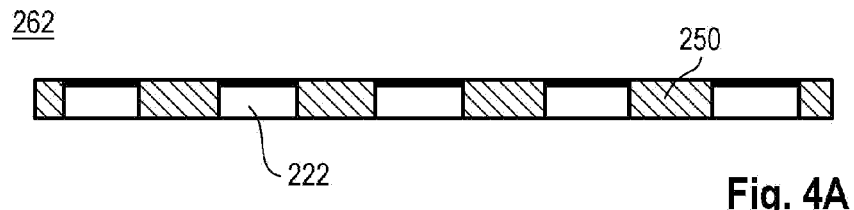
FIGS. 4A-4E show schematic cross-sectional side view representations of examples of semiconductor chip panels.
Figure 4B:
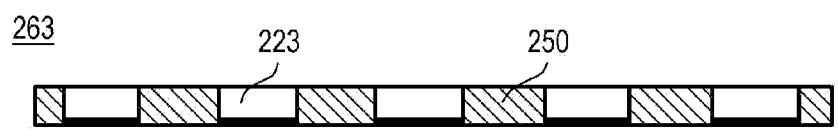

FIG. 4A shows an example of a semiconductor chip panel 262 in which the semiconductor chips 222 are oriented in such a way that the active surface is located remote from the carrier when the semiconductor chips 222 are placed on the carrier, whereas FIG. 4B shows an example of a semiconductor chip panel 263 in which the semiconductor chips 223 are placed in such a way on the carrier that the active surface is facing the carrier.

Figure 4C:

FIG. 4C shows another example of a semiconductor chip panel in which the semiconductor chips 224 are placed on the carrier with different spatial orientation, i.e., a first group of semiconductor chips having their active surfaces facing the carrier and a second group of semiconductor chips having their active surfaces remote from the carrier.

Figure 4D:
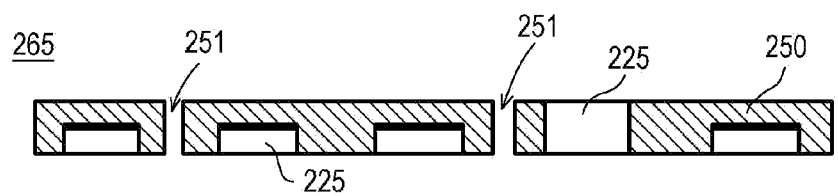

FIG. 4D shows another example of a semiconductor chip panel 265 wherein through-holes 251 are formed in the encapsulation material 250. These through-holes 251 can be formed after the mold process by drilling or lasering, for example. They can be used to form electrical connections between different semiconductor chips as will be shown later.

Figure 4E:
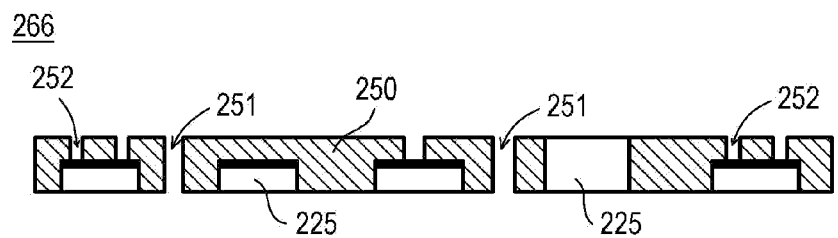

FIG. 4E shows another example a semiconductor chip panel 266 in which through-holes 253 are formed in the encapsulation material 250 and in addition blind-holes 252 are formed in the encapsulation material 250, the blind-holes 252 extending from a main surface of the encapsulation material 250 until the active surface of particular one of the semiconductor chips 225. The blind-holes 252 can also be formed by drilling or lasering.

Figure 5A:
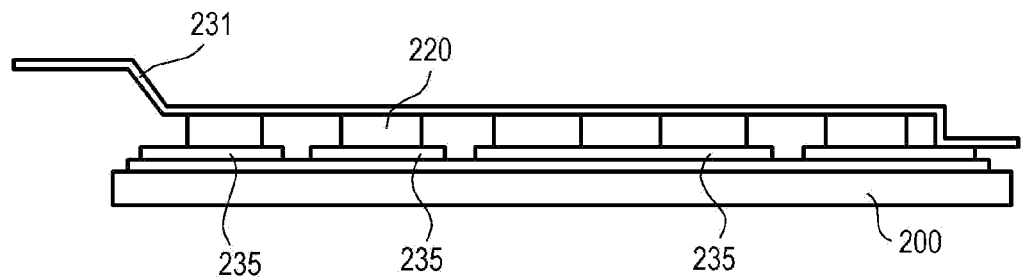
FIGS. 5A-5C show schematic cross-sectional side view representations for illustrating a method for fabricating a semiconductor chip panel by additionally employing a leadframe.
Figure 5B:
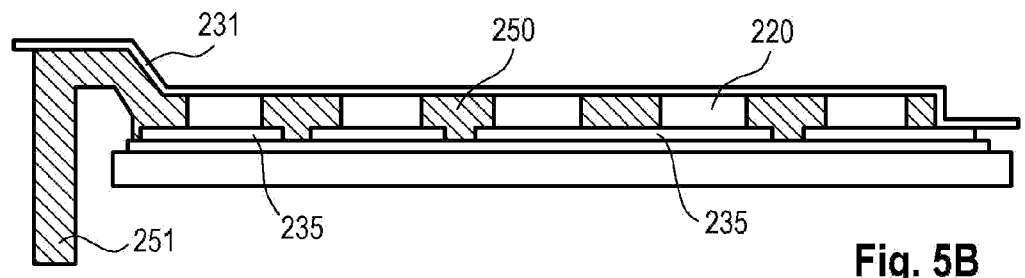
Figure 5C:
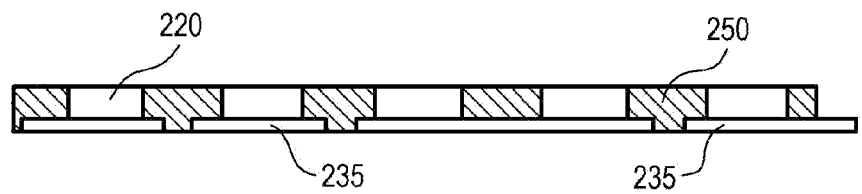

FIGS. 5A-5C show schematic cross-sectional side view representations for illustrating a method for fabricating a semiconductor chip panel according to an embodiment. According to this embodiment, at least one of the semiconductor chips 220 can be placed on an interposer 235 and then the interposers 235 with the attached semiconductor chips 220 can be attached onto the adhesive layer 210 situated on the carrier 200. Each one of the interposers 235 may carry one, two or three, or even more semiconductor chips 220. At the end a semiconductor chip panel 267 is obtained as shown in FIG. 5C. In this semiconductor chip panel 267 the upper main faces of at least one of the semiconductor chips 220 is exposed, i.e., not covered by encapsulation material 250 and the lower main faces are attached to one of the interposers 235 and the lower surfaces of the interposers 235 are themselves exposed. The interposers 235 can in principle be comprised of any sort of solid materials. They can be comprised of one or more leadframes so that, for example, the interposers 235 shown in FIGS. 5A-5C are comprised of the portions of one and the same contiguous leadframe. They can also be comprised of, for example, an insulator, any sort of plastics material as, for example, a thermally conductive plastic material, a ceramic material, or a DCB (direct copper bond) substrate.

In the embodiment as shown in FIGS. 5A-5C the interposers 235 are provided on the second main faces of the semiconductor chips 220. As an alternative or in addition thereto it is also possible to provide one or more interposers on the first, upper main faces of the semiconductor chips 220, so that they are situated between the first, upper main faces and the release layer 231. Also in this case there can be just one contiguous interposer covering a plurality or all semiconductor chips 220 or it can be more than one interposers, each of them covering one or more semiconductor chips.

Figure 6:
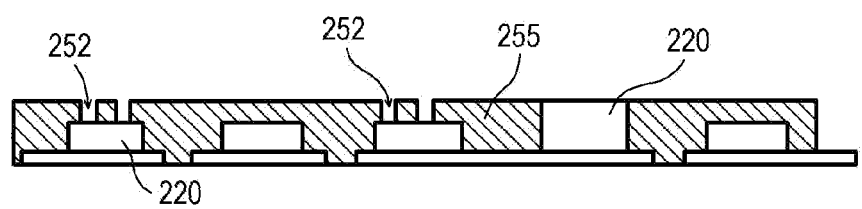
FIG. 6 shows a schematic cross-sectional side view representation of an example of a semiconductor chip panel fabricated by additionally employing a leadframe.

FIG. 6 shows a schematic cross-sectional side view representation for illustrating a further example of a method for fabricating a semiconductor chip panel according to an embodiment. A difference with respect to the embodiment of FIGS. 5A-5C is that the encapsulation material 255 also covers the first upper surfaces of a part of the semiconductor chips 220 and blind-holes 252 are formed in the encapsulation material 255 from the upper surface of the encapsulation material 255 down to the first surfaces of the semiconductor chips 220. The blind-holes 252 can be formed by drilling or lasering.

One advantage of the method for fabricating a semiconductor chip panel, as described so far, is that it yields a semiconductor chip panel in which the semiconductor chips are exposed on both their main surfaces or one surface is exposed and the other surface is attached to a leadframe which is exposed (FIG. 5C) or wherein one surface is exposed by blind-holes through the encapsulation material and the other surface is attached to a leadframe which is exposed (FIG. 6). In the following, examples of semiconductor chip panels are shown which have been processed by the method as described so far and which have been further processed by applying electrical connection wiring and dielectric layers.

Figure 7:
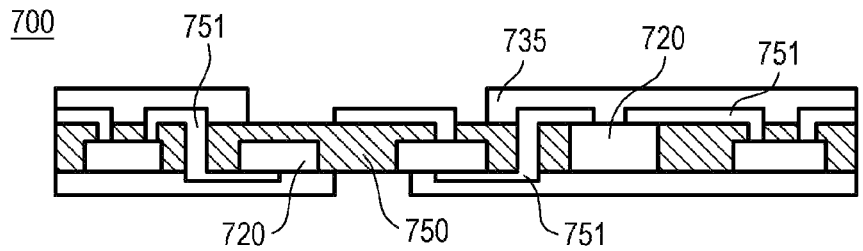
FIG. 7 shows a schematic cross-sectional side view representation of a semiconductor chip panel after further processing according to an example.

FIG. 7 shows a schematic, cross-sectional side view representation of examples of a semiconductor chip panel 700 comprising semiconductor chips 720 embedded in an encapsulation material 750. The semiconductor chips 720 are electrically connected with each other by means of electrical wiring layers 751 and in addition dielectric layers 735 are deposited on predetermined portions of the upper and lower surfaces of the semiconductor chip panel 700. The through-holes and the blind-holes formed into the encapsulation material 750 as shown in previous examples are filled with electrically conductive material and can thus be used to electrically connect different semiconductor chips with each other. This can be done in a similar way with the semiconductor chip panels in which leadframes are used such as those as shown in FIG. 6.

Figure 8A:
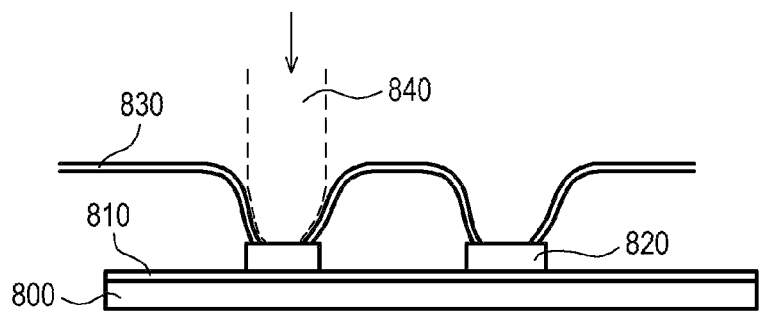
FIGS. 8A-8C show schematic cross-sectional side view representations (A, B) and a top view representation (C) for illustrating an example of a method for fabricating a semiconductor chip panel and a semiconductor chip package wherein the encapsulation material overlaps an edge portion of a main face of the semiconductor chip.
Figure 8B:
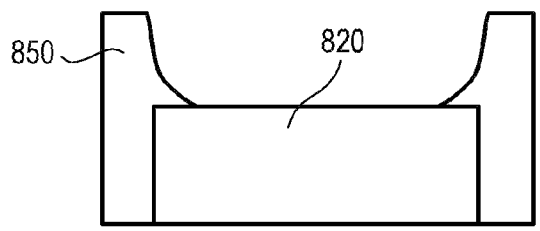
Figure 8C:
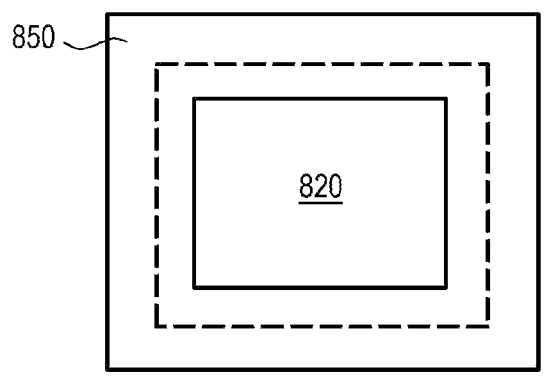

FIGS. 8A-8C illustrate a further example of a method for fabricating a semiconductor chip panel and a semiconductor chip package. FIG. 8A shows a partial section of a carrier 800, an adhesive layer 810 applied onto the carrier 800 and semiconductor chips 820 placed onto the adhesive layer 810. In a molding apparatus a release layer 830 is arranged in such a way above the upper first surfaces of the semiconductor chips 820 are not completely covered by the release layer 830 and instead the release layer 830 is raised at an edge portion in an outward direction on the entire circumference of the edge on the first upper surface of the semiconductor chip 820. This shape of the release layer 830 can be provided by a spring-loaded stamp 840 which presses down the release 830 above each one of the semiconductor chips 820. As a result, in the following transfer molding process the encapsulation material 850 will be applied in such a way to the semiconductor chips 820 that it covers the side edges and also a circumferential edge portion of the upper first surface of the semiconductor chips 820, as can be seen in the cross-sectional representation of FIG. 8B and the top view of FIG. 8C.

One possible application of the embodiment of FIGS. 8A-8C is the fabrication of a sensor package wherein the semiconductor chip 820 is comprised of a sensor chip and the upward projecting portion of the encapsulation material 850 can, for example, be utilized to fix therewith a membrane which can be held between the inner walls of the projecting portion of the encapsulation material 850 and is thus situated above the first upper surface of the semiconductor chip 820.

One further application of the embodiment of FIGS. 8A-8C is the fabrication of an LED (light emitting diode) package wherein the semiconductor chip 820 is comprised of a light emitting diode. The upward projecting portion of the encapsulation material 850 can, for example, be utilized to fix therewith an optical lens which can be held between the inner walls of the projecting portion of the encapsulation material 850 and which serves the purpose to bundle the light emitted by the light emitting diode.

The embodiment of FIGS. 8A-8C can also be utilized for any sort of semiconductor chips which are to be protected on their upper main face against any sort of materials which might be used in the fabrication process. In this application the edge portion covered by the encapsulation material serves the purpose to protect or shield the upper main face of the semiconductor face.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A method for fabricating a semiconductor chip panel, the method comprising:
    providing a carrier;
    providing a plurality of semiconductor chips, the semiconductor chips each comprising a first main face and a second main face opposite to the first main face and side faces connecting the first and second main faces;
    placing the semiconductor chips on the carrier with the second main faces facing the carrier;
    afterwards placing at least one of a polymer film and a polymer foil on the first main faces of the semiconductor chips thereby covering the first main faces of the semiconductor chips;
    applying an encapsulation material by transfer molding thereby forming the semiconductor chip panel, wherein the encapsulation material is applied so that the side faces of the semiconductor chips are covered with the encapsulation material while the first main faces are not; and
    removing the at least one of the polymer film and the polymer foil from the semiconductor chip panel.

2. The method according to claim 1, wherein at least some of the semiconductor chips comprise one or more of a power transistor, a vertical transistor, an MOS transistor, an insulated gate bipolar transistor, a logic circuit, a sensor, and a passive component.

3. The method according to claim 1, wherein the semiconductor chips are similar or identical and are placed on the carrier with similar or different spatial orientation.

4. The method according to claim 1, wherein the semiconductor chips comprise different electrical devices.

5. The method according to claim 1, wherein at least some of the semiconductor chips comprise a thickness in a range from 5 µm-1000 µm.

6. The method according to claim 1, wherein all of the semiconductor chips have an equal thickness.

7. The method according to claim 1 wherein the semiconductor chips comprise different thickness.

8. The method according to claim 1, wherein the encapsulation material comprises one or more of an insulating material, a mold material, a polymer material, a polyimide material, a resin material, an epoxy resin material, a silicone material, a ceramic material, and a glass material.

9. The method according to claim 1, wherein the semiconductor chips are similar or identical and are placed on the carrier with different spatial orientation.

10. The method of claim 1, wherein applying the encapsulation material comprises forming a protruding stabilization ring for stabilizing the semiconductor chip panel.

11. The method of claim 1, wherein the encapsulation material is applied so that the second main faces of the semiconductor chips are not covered with the encapsulation material.

\* \* \* \* \*